United States Patent
Park et al.

(10) Patent No.: US 10,697,064 B2
(45) Date of Patent: Jun. 30, 2020

(54) CHEMICAL VAPOR DEPOSITION APPARATUS

(71) Applicant: LG DISPLAY CO., LTD., Seoul (KR)

(72) Inventors: Seung Chul Park, Gumi-si (KR); Hee-Yeol Kim, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 119 days.

(21) Appl. No.: 14/842,429

(22) Filed: Sep. 1, 2015

(65) Prior Publication Data
US 2016/0060756 A1  Mar. 3, 2016

(30) Foreign Application Priority Data
Sep. 1, 2014 (KR) .................. 10-2014-0115732

(51) Int. Cl.
*C23C 16/458* (2006.01)
*C23C 16/04* (2006.01)

(52) U.S. Cl.
CPC ........ *C23C 16/4586* (2013.01); *C23C 16/042* (2013.01); *C23C 16/4585* (2013.01)

(58) Field of Classification Search
CPC .............. C23C 16/4586; C23C 16/042; C23C 16/4585
See application file for complete search history.

(56) References Cited

U.S. PATENT DOCUMENTS

| 5,611,865 | A | * | 3/1997 | White | C23C 16/042 118/725 |
| 5,803,977 | A | * | 9/1998 | Tepman | C23C 14/50 118/728 |
| 5,855,687 | A | * | 1/1999 | DuBois | C23C 16/04 118/729 |
| 5,891,348 | A | * | 4/1999 | Ye | H01J 37/3244 216/67 |
| 5,895,549 | A | * | 4/1999 | Goto | H01L 21/68742 118/503 |
| 5,900,064 | A | * | 5/1999 | Kholodenko | C23C 16/4585 118/723 E |
| 6,117,349 | A | * | 9/2000 | Huang | H01J 37/32431 156/345.3 |
| 6,355,108 | B1 | * | 3/2002 | Won | C23C 16/24 118/500 |

(Continued)

FOREIGN PATENT DOCUMENTS

KR  10-2006-0046379 A  5/2006
KR  10-2012-0040802 A  4/2012

*Primary Examiner* — Jeffrie R Lund
*Assistant Examiner* — Mirza Israr Javed
(74) *Attorney, Agent, or Firm* — Dentons US LLP

(57) ABSTRACT

A CVD apparatus includes a process chamber, a susceptor, an auxiliary supporting part, a gas spray part, and a shadow frame. The susceptor may be in the process chamber to support and heat a mother substrate. The auxiliary supporting part may be mounted on the susceptor in a tetragonal frame form to support and heat an edge of the mother substrate supported by the susceptor. The gas spray part may be in the process chamber to face the susceptor and may spray a process gas to the mother substrate. The shadow frame may cover an edge of the auxiliary supporting part and an edge of the susceptor extending from the edge of the auxiliary supporting part.

6 Claims, 6 Drawing Sheets

(56) References Cited

U.S. PATENT DOCUMENTS

| | | | | |
|---|---|---|---|---|
| 6,554,954 | B2* | 4/2003 | Ma | H01J 37/32697 |
| | | | | 156/345.51 |
| 6,589,352 | B1* | 7/2003 | Yudovsky | C23C 16/4585 |
| | | | | 118/500 |
| 6,722,938 | B1* | 4/2004 | Komatsu | H01J 9/142 |
| | | | | 225/2 |
| 6,875,280 | B2* | 4/2005 | Ikeda | C23C 16/45521 |
| | | | | 118/719 |
| 7,229,666 | B2 | 6/2007 | Mardian et al. | |
| 2005/0172904 | A1* | 8/2005 | Koshimizu | H01J 37/32623 |
| | | | | 118/728 |
| 2005/0266174 | A1* | 12/2005 | Hou | C23C 16/4585 |
| | | | | 427/569 |
| 2006/0011137 | A1* | 1/2006 | Keller | C23C 16/042 |
| | | | | 118/720 |
| 2006/0207508 | A1* | 9/2006 | Leung | C23C 16/4585 |
| | | | | 118/728 |
| 2007/0184745 | A1* | 8/2007 | Griffin | C23C 14/042 |
| | | | | 445/24 |
| 2010/0243606 | A1* | 9/2010 | Koshimizu | H01J 37/32174 |
| | | | | 216/67 |
| 2014/0158046 | A1* | 6/2014 | Kim | C23C 16/042 |
| | | | | 118/505 |

* cited by examiner

CHEMICAL VAPOR DEPOSITION APPARATUS

CROSS-REFERENCE TO RELATED APPLICATIONS

This application claims the benefit of the Korean Patent Application No. 10-2014-0115732 filed on Sep. 1, 2014, which is incorporated by reference in its entirety for all purposes as if fully set forth herein.

BACKGROUND

1. Field of the Disclosure

The present invention relates to a deposition apparatus for depositing a thin layer on a substrate. More particularly, the invention relates to a chemical vapor deposition apparatus for depositing a thin layer on a substrate through a chemical vapor deposition (CVD) process.

2. Discussion of the Related Art

A flat panel display (FPD) device is used in various electronic devices such as portable phones, tablet personal computers (PCs), notebook computers, etc. Examples of the FPD device include liquid crystal displays (LCD), plasma display panels (PDPs), organic light emitting displays (OLED), etc. Recently, electrophoretic displays (EPD) are being widely used as one type of the FPD device.

In such FPD device (hereinafter simply referred to as a display device), the LCDs are devices that display an image by using the optical anisotropy of liquid crystal. The LCDs have good features such as thinness, lightness, low consumption power, high image quality, etc., and thus, are being widely used.

In the display devices, organic light emitting displays use a self-emitting device that self-emits light, and thus have a fast response time, high emission efficiency, high luminance, a wide viewing angle, etc. Therefore, organic light emitting displays are attracting much attention as next-generation FPD devices.

In order to manufacture a display device, a circuit pattern should be provided on a surface of a mother substrate. To this end, a substrate process should be performed. Here, the substrate processing includes a thin film deposition process of depositing a thin layer on the mother substrate, a photo process of selectively exposing a thin layer by using a photosensitive material, an etching process of forming a pattern by removing a thin layer in a selectively exposed region, etc.

The thin film deposition process may be performed by using a physical vapor deposition (PVD) method or a chemical vapor deposition (CVD) method.

A chemical vapor deposition (CVD) apparatus using the CVD method includes a plasma enhanced chemical vapor deposition (PECVD) apparatus using plasma.

FIG. 1 is an exemplary diagram illustrating a mother substrate of which an edge is covered by a shadow frame applied to a related art CVD apparatus.

In the related art CVD apparatus, a mother substrate 2 is disposed on a susceptor 1, and an edge of the mother substrate 2 is covered by a shadow frame 3. The mother substrate 2 is raised or lowered by a loading pin 4, and thus, the mother substrate 2 is either on the susceptor 1 or is unloaded from the susceptor 1.

When power is supplied to a gas spray part (not shown) and the susceptor 1, a gas is sprayed to the mother substrate 2 through the gas spray part. At this time, plasma is generated between the susceptor 1 and the gas spray part, and a thin layer is deposited on the mother substrate 2 by the plasma.

In the related art CVD apparatus, as illustrated in FIG. 1, the shadow frame 3 covers an edge of the mother substrate 2 and an edge of the susceptor 1 in order to prevent the thin layer formed by the plasma from being deposited on a border of the susceptor 1 as well as the mother substrate 2. This prevents the susceptor 1 from being damaged by the plasma.

However, because the shadow frame 3 covers the edge of the mother substrate 2, a non-deposition area "A" where the thin layer is not deposited is created on the mother substrate 2. Consequently, a usable area of the mother substrate 2 is reduced, and for this reason, the number of display devices manufactured based on one mother substrate 2 is reduced.

Moreover, the shadow frame 3 is brought in contact with the mother substrate 2, and for this reason, the mother substrate 2 may be damaged.

Also, as illustrated in FIG. 1, because an outermost region of the mother substrate 2 is covered by the shadow frame 3, a thin layer is inevitably deposited on the outermost region. For this reason, the use efficiency of the mother substrate 2 is reduced. Also, in a process of depositing a thin layer by using the related art CVD apparatus, plasma reacts with the mother substrate 2 in the outermost region of the mother substrate 2 or reacts with the susceptor 1 at an edge of the susceptor 1, causing abnormal discharging of plasma. Consequently, the thin layer is not uniformly deposited, causing a defect.

SUMMARY

Accordingly, the present invention is directed to provide a chemical vapor deposition apparatus that substantially obviates one or more problems due to limitations and disadvantages of the related art.

An aspect of the present invention is directed to provide a CVD apparatus in which a top of a susceptor is covered not to be exposed to plasma, and a whole surface of a mother substrate is exposed.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a chemical vapor deposition (CVD) apparatus including a process chamber, a susceptor, an auxiliary supporting part, a gas spray part, and a shadow frame. The susceptor may be in the process chamber to support and heat a mother substrate. The auxiliary supporting part may be on the susceptor in a tetragonal frame form to support and heat an edge of the mother substrate supported by the susceptor. The gas spray part may be in the process chamber to face the susceptor and may spray a process gas to the mother substrate. The shadow frame may cover an edge of the auxiliary supporting part and an edge of the susceptor extending from the edge of the auxiliary supporting part.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE DISCLOSURE

Reference will now be made in detail to the exemplary embodiments of the present invention, examples of which are illustrated in the accompanying drawings. Wherever possible, the same reference numbers will be used throughout the drawings to refer to the same or like parts.

Hereinafter, a CVD apparatus according to embodiments of the present invention will be described in detail with reference to the accompanying drawings.

Figure 1:
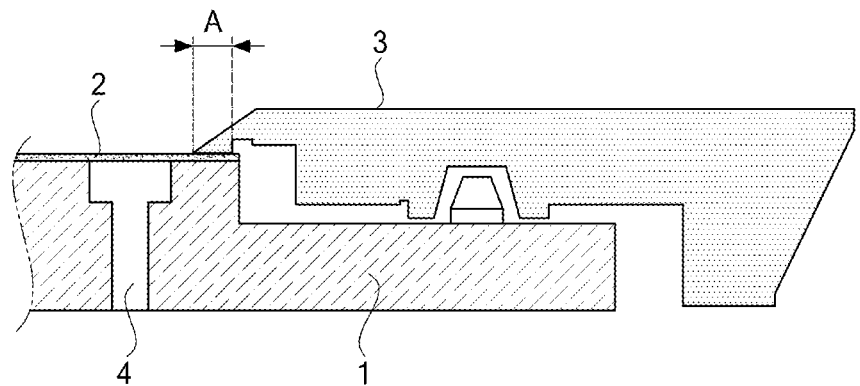
FIG. 1 is an exemplary diagram illustrating a mother substrate of which an edge is covered by a shadow frame applied to a related art CVD apparatus.
Figure 2:
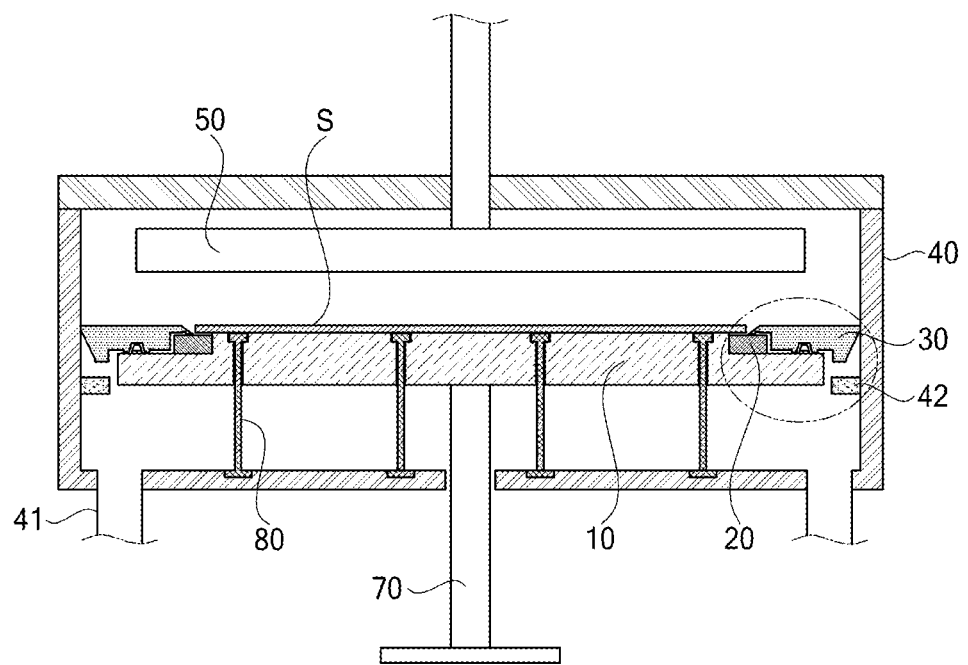
FIG. 2 is a diagram for describing a CVD apparatus according to an exemplary embodiment of the present invention.

FIG. 2 is a diagram for describing a CVD apparatus according to an exemplary embodiment of the present invention. FIG. 3 illustrates a cross-sectional view and a plan view of a susceptor applied to a CVD apparatus according to a first exemplary embodiment of the present invention. FIG. 4 illustrates a cross-sectional view and a plan view of a susceptor applied to a CVD apparatus according to a second exemplary embodiment of the present invention.

As illustrated in FIGS. 2 to 4, the CVD apparatus may include: a process chamber 40; a susceptor 10 that is installed in the process chamber 40 to support and heat a mother substrate S; an auxiliary supporting part 20 that is mounted on the susceptor 10 in a tetragonal frame form to support and heat an edge of the mother substrate S supported by the susceptor 10; a gas spray part 50 that is installed in the process chamber 40 to face the susceptor 10 and sprays a process gas to the mother substrate S; and a shadow frame 30 that covers an edge of the auxiliary supporting part 20 and an edge of the susceptor 10 extending from the edge of the auxiliary supporting part 20.

First, the process chamber 40 may provide a space for performing a thin film deposition process using plasma.

An entrance (not shown) through which the mother substrate S is loaded or unloaded may be provided on one side of the process chamber 40. At least one exhaust port 41 for exhausting an internal gas of the process chamber 40 may be provided on a floor of the process chamber 40.

Second, the gas spray part 50 may be in the chamber 40 to face the susceptor 10. The gas spray part 50 may be coupled to a gas supply pipe passing through an upper surface of the process chamber 40.

The gas spray part 50 may uniformly diffuse a process gas supplied through the gas supply pipe to spray the process gas to the mother substrate S disposed in the susceptor 10.

Moreover, the gas spray part 50 may be coupled to a power supply through a power cable and may be supplied with power from the power supply. Plasma may be generated in a space between the gas spray part 50 and the susceptor 10 according to the power applied to the gas spray part 50 and power applied to the susceptor 10.

Third, the susceptor 10 may be installed in the process chamber 40 to be raised and lowered and may support the mother substrate S loaded into the process chamber 40.

The susceptor 10 may be supported to be raised and lowered by an elevation part 70 passing through the floor of the process chamber 40.

The susceptor 10 may be equipped with a heater (not shown). The susceptor 10 may include an outer portion 11, where the auxiliary supporting part 20 is located, and a protrusion portion 12 that protrudes in a direction from an inner side of the outer portion 11 to a top of the outer portion 11. The mother substrate S may be located at the protrusion portion 12.

The outer portion 11 may be formed of a metal material such as aluminum (Al) and/or the like. The outer portion 11 may be one body with the protrusion portion 12. The heater (not shown) for heating the mother substrate S may be built into the outer portion 11.

The protrusion portion 12 may protrude in the direction from the inner side of the outer portion 11 to the top of the outer portion 11 to have an area which is smaller than that of the mother substrate S. The protrusion portion 12 may be one body with the outer portion 11, or may be separate from the outer portion 11. The protrusion portion 11 may be formed of a metal material such as Al and/or the like. When the protrusion portion 12 and the mother substrate S at the protrusion portion 12 are heated in the process chamber 40, the protrusion portion 12 and the mother substrate S may expand. In this case, a degree to which the mother substrate S is expanded may be larger than a degree to which each of the protrusion portion 12 and the outer portion 11 is expanded, and thus, an area of the protrusion portion 12 may be smaller than that of the mother substrate S.

A shape of a top of the protrusion portion 12 may be the same as that of the mother substrate S.

Heights of side surfaces of the protrusion portion 12 protruding from the top of the outer portion 11 may be the same as that of the auxiliary supporting part 20. Therefore, a top of the auxiliary supporting part 20 may be parallel to the top of the protrusion portion 12.

In this case, the auxiliary supporting part 20 may be at the outer portion 11 and may surround the side surfaces of the protrusion portion 12.

A supporting pin 80 supporting the mother substrate S may be provided as three or more at the protrusion portion 12. A first embodiment of the present invention and a second embodiment of the present invention may have a difference in positions of the supporting pin 80, as illustrated in FIGS. 3 and 4.

<Structure of Susceptor 10 Applied to First Embodiment>

In the susceptor 10 according to the first embodiment of the present invention, as illustrated in FIG. 3, the supporting pin 80 may be provided at the inner side of the protrusion portion 12.

Here, the inner side of the protrusion portion 12 may denote an inner side of each of the side surfaces of the protrusion portion 12. In FIG. 3, each of the side surfaces of the protrusion portion 12 may denote a boundary surface that divides the protrusion portion 12 and the outer portion 11. To provide an additional description, each of the side surfaces of the protrusion part 12 may denote a surface protruding from the top of the outer portion 11. The inner side of the protrusion portion 12 may denote an inner side of each of four side surfaces configuring the protrusion portion 12.

<Structure of Susceptor 10 Applied to Second Embodiment>

In a susceptor 10 according to the second embodiment of the present invention, as illustrated in FIG. 4, the supporting pin 80 may be at a boundary surface between the protrusion portion 12 and the auxiliary supporting part 20.

Figure 4A:
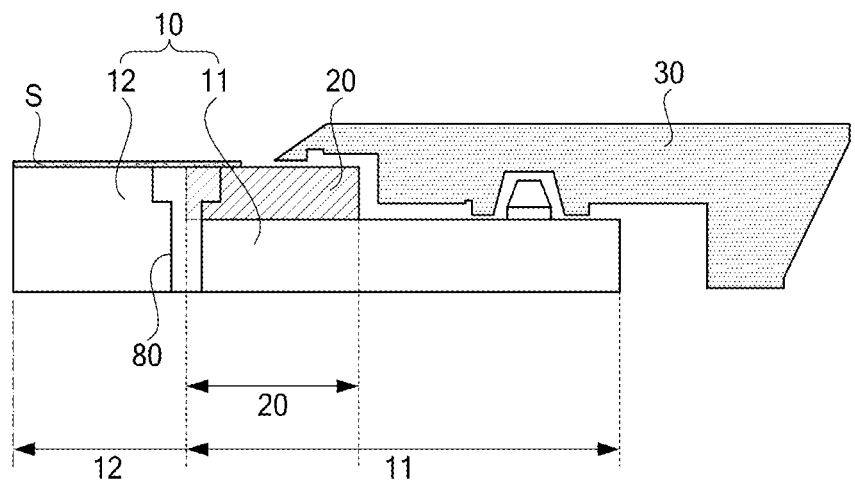
FIG. 4A and FIG. 4B illustrate a cross-sectional view and a plan view of a susceptor applied to a CVD apparatus according to a second exemplary embodiment of the present invention.
Figure 4B:
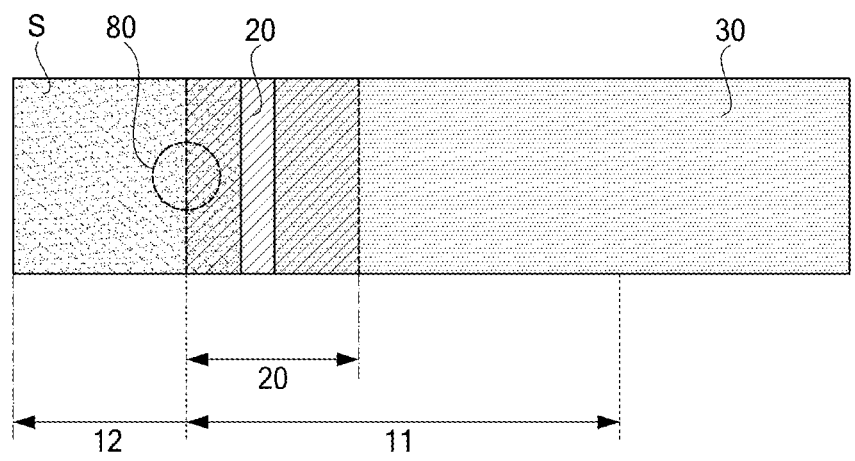

For example, as illustrated in FIG. 4B, the supporting pin 80 may be raised or lowered through a supporting pin hole, which is at a side surface of the protrusion portion 12 and the side surface of the auxiliary supporting part 20, to support the mother substrate S.

To provide an additional description, the supporting pin 80 may be inserted into a supporting pin hole (not shown) and may be raised or lowered through the supporting pin hole to support the mother substrate S. Here, the supporting pin hole may be provided by a combination of a hemisphere-shaped piece plate groove (not shown), which is at a first side surface of the side surfaces of the auxiliary supporting part 20 closely adhered to the susceptor 10, and a hemisphere-shaped susceptor groove (not shown) that is at the side surface of the protrusion portion 12 and is closely adhered to the piece plate groove.

The auxiliary supporting part 20 may be in a tetragonal frame form and may be mounted on the susceptor 10 to support and heat an edge of the mother substrate S supported by the susceptor 10.

The auxiliary supporting part 20 may be formed of a material that has thermal conductivity and is a nonconductor. For example, the auxiliary supporting part 20 may be formed of ceramic and/or the like.

The auxiliary supporting part 20 may transfer heat of the susceptor 10 to the edge of the mother substrate S on the susceptor 10 to heat the edge of the mother substrate S.

The auxiliary supporting part 20 may be on a top of the outer portion 11 in the susceptor 10 and may surround the side surface of the protrusion portion 12. In this case, as illustrated in FIGS. 3 and 4, the mother substrate S may be on the protrusion portion 12, and an outer portion of the mother substrate S may protrude outside the protrusion portion 12 and may be on the top of the auxiliary supporting part 20.

Therefore, the auxiliary supporting part 20 prevents the side surface of the protrusion portion 12 and the top of the outer portion 11 from being externally exposed. Accordingly, when a deposition process is being performed in the process chamber 40, plasma generated in the process chamber 40 is prevented from being transferred to the protrusion portion 12 and the outer portion 11.

To provide an additional description, a width of the protrusion portion 12 may be slightly smaller than that of the mother substrate S, and a length of the protrusion portion 12 may be slightly smaller than that of the mother substrate S. The auxiliary supporting part 20 may surround the side surface of the protrusion portion 12 and cover the top of the outer portion 11.

In this case, the mother substrate S may be located on the top of the protrusion portion 12 and the top of the auxiliary supporting part 20, and the edge of the auxiliary supporting part 20 may be covered by the shadow frame 30. For example, the shadow frame 30 may cover the edge of the auxiliary supporting part 20 and the susceptor 10 (i.e., the edge of the outer portion 11) which extends from the edge of the auxiliary supporting part 20.

Therefore, when perceived from the gas spray part 50, the top of the protrusion portion 12 and the top of the outer portion 11 may not be exposed. Accordingly, the plasma generated in the process chamber 40 may not be brought in contact with the protrusion portion 12 and the outer portion 11, thereby preventing plasma from being abnormally discharged.

A detailed configuration of the auxiliary supporting part 20 will be described later below with reference to FIGS. 5 to 8.

The shadow frame 30, as illustrated in FIGS. 3 and 4, may cover the edge of the auxiliary supporting part 20 and the susceptor 10 (i.e., the edge of the outer portion 11) which extends from the edge of the auxiliary supporting part 20.

The shadow frame 30, as illustrated in FIG. 2, may be hung on a shadow frame hanger 42 located in the process chamber 40. In this case, when the susceptor 10 is lowered by the elevation part 70, the shadow frame 30 may be hung on the shadow frame hanger 42. Subsequently, when the susceptor 10 is raised by the elevation part 70, the shadow frame 30 may be raised along with the susceptor 10 in a state of covering the auxiliary supporting part 20 and the outer portion 11.

Figure 3A:
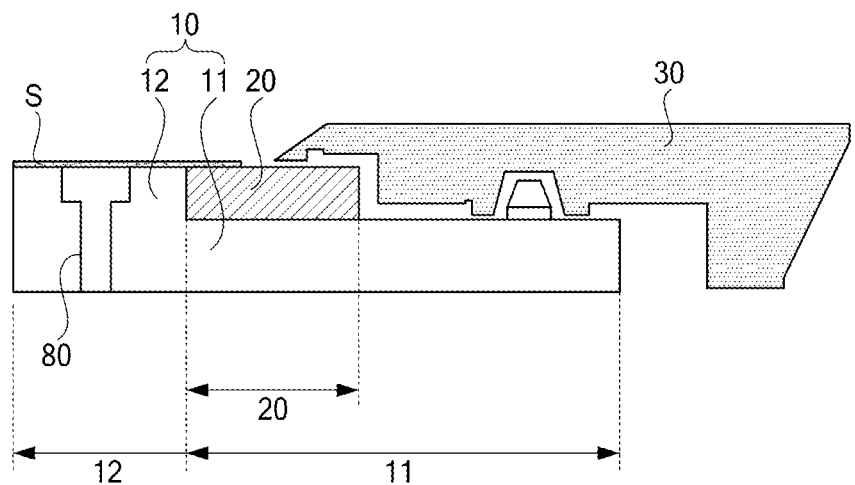
FIG. 3A and FIG. 3B illustrate a cross-sectional view and a plan view of a susceptor applied to a CVD apparatus according to a first exemplary embodiment of the present invention.
Figure 3B:
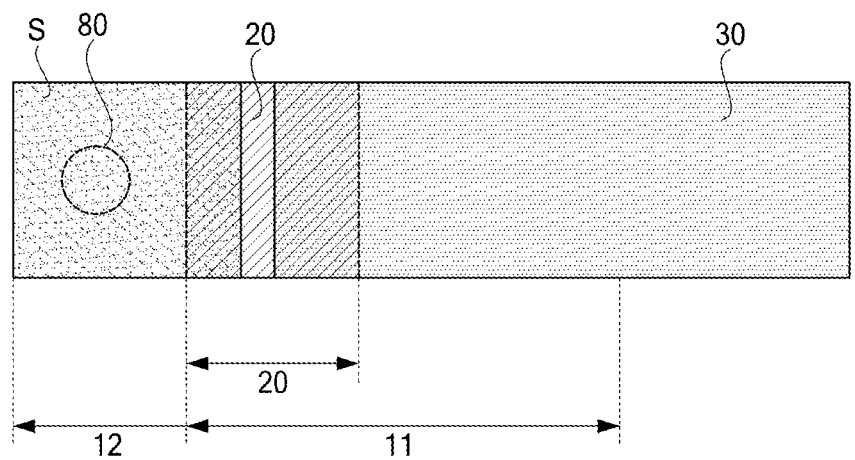

In this case, in order for the shadow frame not to directly contact the top of the auxiliary supporting part 20 and the top of the outer portion 11, as illustrated in FIG. 3A and FIG. 4A, a shadow frame supporting part supporting the shadow frame 30 may be in the susceptor 10.

An interval between the elements such as the mother substrate S, the protrusion portion 12, the auxiliary supporting part 20, and the shadow frame 30 may be set as follows.

An interval between the shadow frame 30 and the mother substrate S may be about 4.0 mm with respect to the mother substrate S before the deposition process is performed. When the deposition process is performed, an internal temperature of the process chamber 40 may rise, and thus, the mother substrate S may be raised. Therefore, as described above, the mother substrate S may be spaced apart from the shadow frame 30 by an interval of about 4.0 mm.

Moreover, according to the second embodiment of the present invention, a length from a central axis of the supporting pin 80 to a corner of the edge of the mother substrate S may be about 5.5 mm. Therefore, a portion of the auxiliary supporting part 20 corresponding to the length of about 5.5 mm may be covered by the mother substrate S.

Moreover, according to the second embodiment of the present invention, a length from the central axis of the supporting pin 80 to a corner of the edge of the auxiliary supporting part 20 may be about 20 mm. In this case, as described above, a portion of the auxiliary supporting part 20 corresponding to the length of about 20 mm may be covered by the mother substrate S.

Since the portion of the auxiliary supporting part 20 corresponding to the length of about 5.5 mm is covered by the mother substrate S, an interval between the mother substrate S and the shadow frame 30 is 4.0 mm or more, and a width of the auxiliary supporting part 20 is about 20 mm, a portion of the auxiliary supporting part 20 corresponding to a length of about 10.5 mm may be covered by the shadow frame 30.

An interval between the shadow frame 30 and the auxiliary supporting part 20 may be 0.2 mm to 0.5 mm. If the interval increases, the plasma which is generated in the deposition process may flow through a space corresponding to the interval and may react with the outer portion 11. Also, if the interval is reduced, the shadow frame 30 may be brought in contact with the auxiliary supporting part 20, and for this reason, the auxiliary supporting part 20 may be damaged.

Hereinafter, a method of operating the CVD apparatus having the above-described configuration according to an embodiment of the present invention will be briefly described.

First, the elevation part 70 may be lowered, and thus, the supporting pins 80 may protrude to the top of the susceptor 10.

Subsequently, the mother substrate S may be loaded into the process chamber 40 and may be located on the supporting pins 80.

Subsequently, the susceptor 10 may be raised by the elevation part 70. In this case, the susceptor 10 may be raised, and particularly, the shadow frame 30 hung on the shadow frame hanger 42 may be raised along with the susceptor 10.

The shadow frame 30 may not cover the mother substrate S. That is, the shadow frame 30 may be spaced apart from the mother substrate S by a certain interval and may cover the edge of the auxiliary supporting part 20 and the outer portion 11.

Subsequently, when the susceptor 10 is raised to a predetermined position, the elevation part 70 may stop, and the supporting pins 80 may be inserted between a plurality of supporting pin holes (not shown). Therefore, the mother substrate S may be at a position for the deposition process.

In this configuration, the susceptor 10 may be covered by the shadow frame 30, the auxiliary supporting part 20, and the mother substrate S.

The shadow frame 30 cannot contact the top of the mother substrate S and the top of the auxiliary supporting part 20 due to the susceptor 10, and particularly, due to the shadow frame supporting part mounted on the top of the outer portion 11.

Subsequently, an internal state of the process chamber 40 may be changed to a vacuum state, and when power is applied to the gas spray part 50, the gas spray part 50 may spray a gas to the mother substrate S. Therefore, plasma may be generated between the mother substrate S and the gas spray part 50, and a thin layer may be deposited all over the mother substrate S due to the plasma.

In this case, according to the present embodiment, the mother substrate S may not be covered by any structure, and thus, the thin layer may be deposited all over the mother substrate S.

Moreover, according to the present embodiment, a usable area of the mother substrate S may be the entire mother substrate S area.

Moreover, according to the present embodiment, an upper end of the mother substrate S may not contact any structure, thereby preventing the mother substrate S from being damaged.

Moreover, according to the present embodiment, because the susceptor 10 is covered by the mother substrate S, the auxiliary supporting part 20, and the shadow frame 30, the susceptor 10 is not directly exposed to the plasma. Therefore, plasma is prevented from being abnormally discharged due to contact between the plasma and the susceptor 10.

Moreover, according to the present embodiment, heat generated from the outer portion 11 may be transferred to the edge of the mother substrate S through the auxiliary supporting part 20, and thus, a thin layer may be uniformly deposited on the edge of the mother substrate S.

Finally, the above-described operations may be reversed, and thus, the mother substrate S on which the thin layer is deposited may be unloaded from the process chamber to the outside.

For example, when the deposition process is performed, the susceptor 10 may be lowered, and thus, the supporting pin 80 may protrude to a surface of the protrusion portion 12 to support the mother substrate S.

The shadow frame 30 may be lowered along with the susceptor 10, and then may be hung on the shadow frame hanger 42.

When the lowering of the susceptor 10 is completed, the mother substrate S may be unloaded from the process chamber 40 to the outside.

Figure 5:
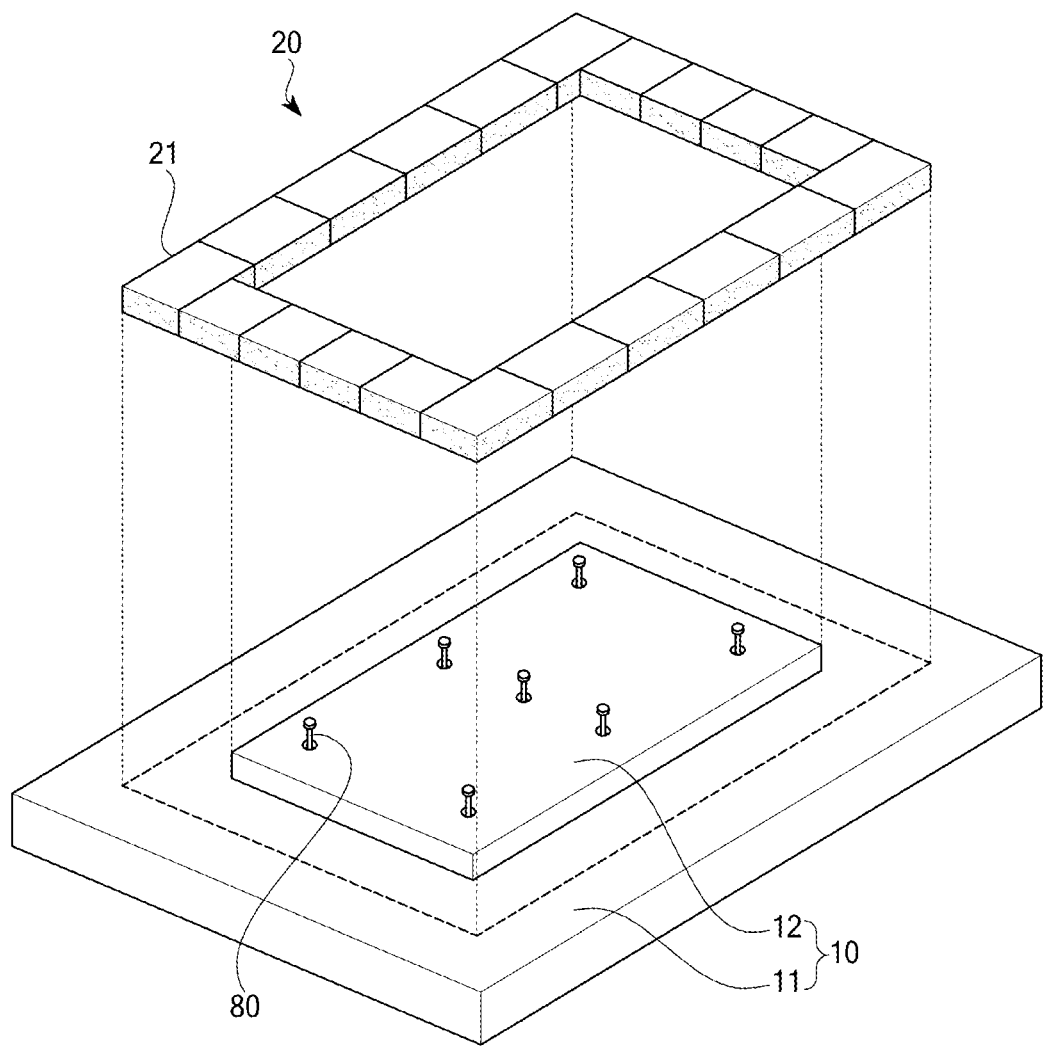
FIG. 5 is a perspective view illustrating a susceptor and an auxiliary supporting part applied to a CVD apparatus according to an exemplary embodiment of the present invention.
Figure 6:
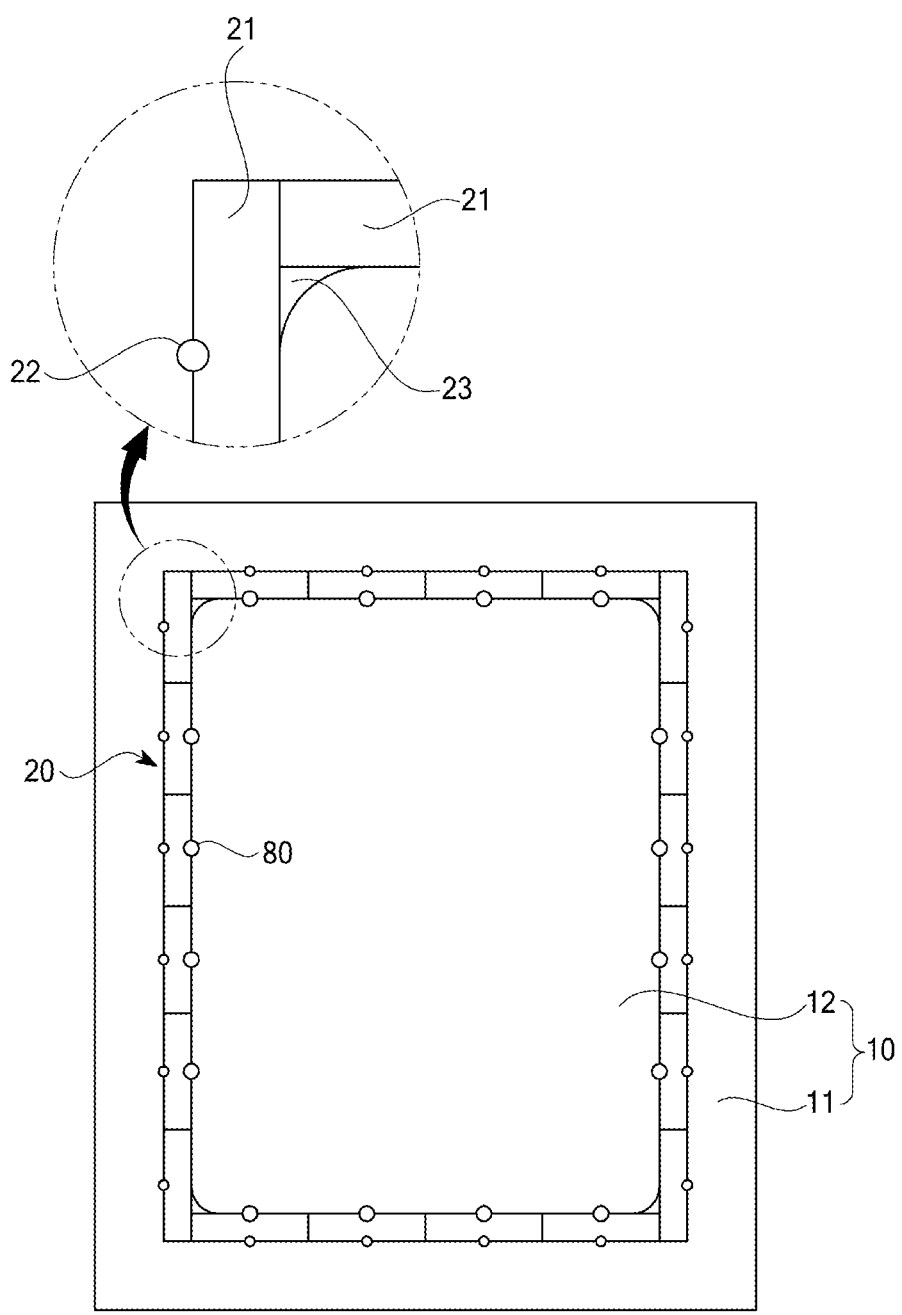
FIG. 6 is a plan view illustrating a susceptor and an auxiliary supporting part applied to a CVD apparatus according to an exemplary embodiment of the present invention.

FIG. 5 is a perspective view illustrating a susceptor and an auxiliary supporting part applied to a CVD apparatus according to an embodiment of the present invention. FIG. 6 is a plan view illustrating a susceptor and an auxiliary supporting part applied to a CVD apparatus according to an embodiment of the present invention. FIG. 7 illustrates a plan view and a side view of one fragment plate configuring a susceptor applied to a CVD apparatus according to an embodiment of the present invention. FIG. 8 is a plan view illustrating a state where three piece plates configuring a susceptor applied to a CVD apparatus according to an embodiment of the present invention are connected to each other.

First, as illustrated in FIG. 5, the auxiliary supporting part 20 may be located at the outer portion 11 and may surround the side surface of the protrusion portion 12.

The top of the auxiliary supporting part 20 may be in parallel with the top of the protrusion portion 12. That is, a height of the auxiliary supporting part 20 may be the same as or almost similar to a height from the top of the protrusion portion 12 to the top of the outer portion 11. Therefore, the mother substrate S may be stably supported on the top of the protrusion portion 12 and the top of the auxiliary supporting part 20.

The supporting pins 80 may be mounted on the protrusion portion 12. Each of the supporting pins 80 may be vertically oriented to pass through the protrusion portion 12 configuring the susceptor 10. To this end, a plurality of supporting pin holes into which the plurality of supporting pins are vertically through-inserted may be provided at the protrusion portion 12 of the susceptor 10.

The supporting pins 80 may be at various positions of the protrusion portion 12. In FIG. 5, the protrusion portion 12 and the auxiliary supporting part 20 according to the first embodiment described above with reference to FIG. 3 are illustrated. In the first embodiment of the present invention, the supporting pins 80 may be on an inner side of the protrusion portion 12.

In the above description made on the second embodiment of the present invention, it has been described that the supporting pins 80 are at the boundary surface between the protrusion portion 12 and the auxiliary supporting part 20. An example of this is illustrated in FIG. 6. That is, as illustrated in FIG. 6, the supporting pins 80 according to the second embodiment of the present invention may be at the boundary surface between the side surface of the protrusion portion 12 and the auxiliary supporting part 20. However, as illustrated in FIG. 5, the supporting pins 80 may be at the inner side of the protrusion portion 12 according to the second embodiment of the present invention in addition to positions illustrated in FIG. 6.

Second, the auxiliary supporting part 20 may include a plurality of piece plates 21.

For example, as illustrated in FIGS. 5 and 6, the auxiliary supporting part 20 may be configured with the plurality of piece plates 21, and the piece plates 21 may be fixed to the outer portion 11 by a fixing bolt 22 passing through a corresponding piece plate 21.

Particularly, in the CVD apparatus according to the second embodiment of the present invention, as illustrated in FIG. 6, each of the piece plates 21 may be fixed to the outer portion 11 by a supporting pin 80 and a fixing bolt 22 passing through a corresponding piece plate 21.

In this case, in consideration of the thermal expansion of the piece plates 21, as illustrated in FIG. 7, a fixing bolt 22 may be inserted into a fixing bolt groove 24 having a hemispherical shape to fix a corresponding piece plate 21. A piece plate groove 25 having a shape similar to that of the fixing bolt groove 24 may be on the opposite side from the fixing bolt groove 24. A supporting pin 80 may be inserted into a piece plate groove 25. Both side surfaces of the piece plate 21 may be supported by the fixing bolt 22 and the supporting pin 80, and thus, the piece plate 21 may be fixed to the outer portion 11.

As described above, a supporting pin 80 may be inserted into a hemisphere-shaped piece plate groove 25, which is at the first side surface of side surfaces of the piece plate 21 which is closely adhered to the susceptor 10 (particularly, the protrusion portion 12), and a hemisphere-shaped susceptor groove (not shown), which is at the protrusion portion 12 and is closely adhered to the piece plate groove 25, to support the mother substrate S.

For example, the supporting pin 80 (see illustrated in FIG. 4B) may be inserted into the susceptor groove which is at the protrusion portion 12 and the piece plate groove 25 which is at the supporting part 20, such that one half of the supporting pin 80 is directed toward the protrusion portion 12 and the other half of the supporting pin 80 is in a direction toward the auxiliary supporting part.

To provide an additional description, as described above, the auxiliary supporting part 20 may be divided into the plurality of piece plates 21, for minimizing a thermal expansion difference at high temperature.

In this case, the piece plate 21 may be fixed to the outer portion 11 by one supporting pin 80 and one fixing bolt 22. The fixing bolt 22 may be fixed to a center portion in a lengthwise direction of the piece plate 21, and the supporting pin 80 may be fixed to various positions of the piece plate 21. Also, in the second embodiment of the present invention, the auxiliary supporting part 20 may be configured with the piece plates 21. In this case, the fixing bolt 22 may be one or more, and a position at which the fixing bolt 22 is located on the piece plate 21 may be changed.

The fixing bolt 22 prevents the supporting pin 80 from being twisted due to the thermal expansion of the piece plates 21 and minimizes an interval between adjacent piece plates 21.

A thickness of each of the piece plates 21 may be equal to or less than a step height of the protrusion portion 12, namely, a height of the protrusion portion 12. That is, when the temperature is changed, the thickness of each of the piece plates 21 may be changed, and for this reason, may not match the height of the protrusion portion 11. In order to solve such a problem, the thickness of each of the piece plates 21 may be equal to or less than the height of the protrusion portion 12.

For example, the thickness (a height) of each of the piece plates 21 may be less than 5.6 mm which is the step height of the protrusion portion 12.

Third, with respect to a cross-sectional surface vertical to the top of the auxiliary supporting part 20, two adjacent piece plates 21 may overlap each other. For example, each of the piece plates 21 configuring the auxiliary supporting part 20 may include an overlap portion 27 illustrated as a dotted line in FIG. 7A. To provide an additional description, as illustrated in FIG. 7B, a length of an upper end of the piece plate 21 may be longer than that of a lower end of the piece plate 21.

Moreover, although not shown in detail in the drawing, other piece plates 21 coupled to the piece plate 21 illustrated in FIG. 7 may each include an overlap portion 27. In this case, unlike the piece plate 21 illustrated in FIG. 7, the overlap portion 27 included in each of the other piece plates 21 may be provided so that a length of an upper end of each of the other piece plates 21 is shorter than that of a lower end of each of the other piece plates 21.

Therefore, when two piece plates 21 respectively including a plurality of overlap portions 27 having different shapes are coupled to each other as illustrated in FIG. 8, the overlap portions 27 respectively included in the two piece plates 21 may overlap each other.

For example, when an overlap portion 27 of a second piece plate 21 at a middle portion among three piece plates 21 illustrated in FIG. 8 is configured in a shape illustrated in FIG. 7, an overlap portion 27 of a first piece plate 21 coupled to a left side of the second piece plate 21 and an overlap portion 27 of a third piece plate 21 coupled to a right side of the second piece plate 21 may each be provided so that a length of an upper end of a corresponding piece plate 21 is shorter than that of a lower end of the corresponding piece plate 21.

A length by which the piece plates 21 overlap each other may be adjusted to a minimum of 5 mm or more. For example, in FIG. 7A, a length (i.e., a length by which the piece plates 21 illustrated in FIG. 8 overlap each other) from a left end of the piece plate 21 to a dotted line may be 5 mm or more. To provide an additional description, a length protruding from a left end of the piece plate 21 illustrated in FIG. 7B may be 5 mm or more.

Moreover, a thickness of an area protruding from the left end of the piece plate 21 illustrated in FIG. 7B may be adjusted to 1 mm or less. The reason is for minimizing a space where a gap occurs in a connection portion between the piece plates 21 due to a thermal expansion difference at high temperature.

Figure 7A:
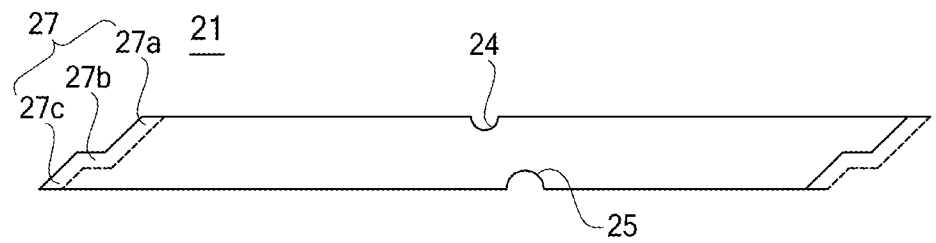
FIG. 7A and FIG. 7B illustrate a plan view and a side view of one fragment plate configuring a susceptor applied to a CVD apparatus according to an exemplary embodiment of the present invention.
Figure 7B:
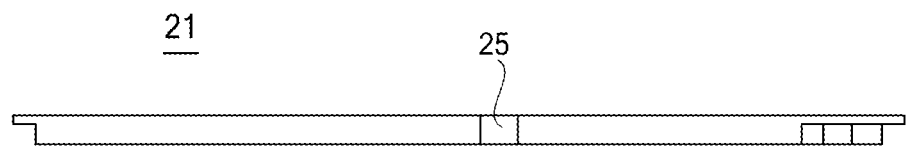
Figure 8:
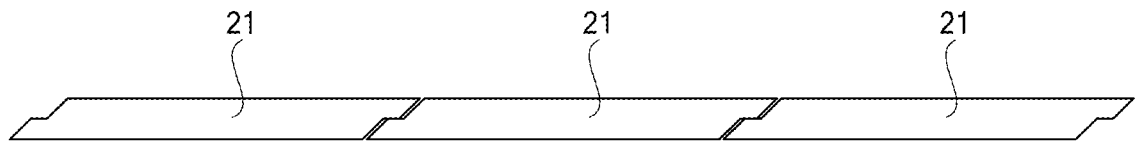
FIG. 8 is a plan view illustrating a state where three piece plates configuring a susceptor applied to a CVD apparatus according to an exemplary embodiment of the present invention are connected to each other.

Fourth, when seen from the top of the auxiliary supporting part 20, as illustrated in FIG. 7A and FIG. 8, the overlap portion 27 where two adjacent piece plates 21 overlap each other may include a first section 27a that has an angle which is greater than 40 degrees and less than 50 degrees, a rectilinear section 27b that is parallel to a lengthwise direction of each of the piece plates 21, and a second section 27c that has an angle which is greater than 40 degrees and less than 50 degrees.

Even when a space occurs between the overlap portions 27, as described above, the overlap portions 27 may be distinguished from a periphery thereof due to a three-stage structure, thereby preventing the plasma from being abnormally discharged.

However, each of the overlap portions 27 may be provided in a two-stage structure. That is, even when the space occurs between the overlap portions 27, the space may be distinguished from a periphery thereof due to the two-stage structure, thereby preventing the plasma from being abnormally discharged. Each of the piece plates 21 may be provided in the three-stage structure as illustrated in FIG. 7, and thus, even when a width of the piece plate 21 is broadened, the plasma is prevented from abnormally being discharged.

Fifth, four corners configuring the protrusion portion 12 may be rounded, and four inner corners of the auxiliary supporting part 20 which are closely adhered to the four corners of the protrusion portion 12 may be rounded to correspond to shapes of the four corners of the protrusion portion 12. When it is difficult for the corners to be rounded, the corners may be cut at intervals of 5 mm. In this case, each of the corners may be provided in a shape similar to a round shape.

Generally, four corners of the mother substrate S may be rounded. In this case, if the corners of the protrusion portion 12 and the corners of the auxiliary supporting part 20 are not rounded, the corners of the protrusion portion 12 may not be covered by the corners of the mother substrate S. In this case, the plasma may be brought in contact with the protrusion portion 12, and for this reason, the plasma is abnormally discharged.

In order to prevent such abnormal discharge, as illustrated in an enlarged circular block of FIG. 6, the corners of the protrusion portion 12 may be rounded, and moreover, the corners of the auxiliary supporting part 20 may be rounded.

Particularly, a rounded region (i.e., a round portion 23) of the auxiliary supporting part 20 may be provided as one body with one of the piece plates 21 on the corners of the auxiliary supporting part 20, or may be manufactured separately from the piece plates 21 and then may be fastened to the outer portion 12 by a separate fastening arrangement.

Moreover, one of the piece plates 21 at one of the corners may be provided in a shape illustrated in the enlarged circular block of FIG. 6 unlike the other piece plates 21.

For example, two piece plates 21 at one corner and the round portion 23 between the two piece plates 21 are illustrated in the enlarged circular block of FIG. 6, but the two piece plates 21 and the round portion 23 illustrated in the enlarged circular block of FIG. 6 may be implemented as one piece plate 21.

As described above, according to the embodiments of the present invention, since a thin layer is deposited all over the mother substrate, the number of manufactured display devices increases, and the cost of materials is reduced.

Moreover, according to the embodiments of the present invention, plasma is prevented from being abnormally discharged because the plasma reacts with the mother substrate or the susceptor.

Moreover, according to the embodiments of the present invention, the characteristic (for example, a thickness and the like) of a thin layer deposited all over the mother substrate is more uniform.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A chemical vapor deposition (CVD) apparatus comprising:
   a process chamber;
   a susceptor in the process chamber to support and heat a mother substrate;
   an auxiliary supporting part on the susceptor to support and heat an edge of the mother substrate supported by the susceptor;
   a gas spray part in the process chamber facing the susceptor, the gas spray part spraying a process gas to the mother substrate; and
   a shadow frame configured to be spaced apart from the mother substrate and supported by the susceptor, such that a whole surface of the mother substrate is exposed to the process gas, and to cover an edge of the auxiliary supporting part and an edge of the susceptor extending from the edge of the auxiliary supporting part,
   wherein a distance between a bottom surface of the shadow frame covering the edge of the auxiliary supporting part and a top surface of the auxiliary supporting part is from 0.2 mm to 0.5 mm,
   wherein the mother substrate is positioned on a horizontal top surface of the auxiliary supporting part, and the shadow frame is positioned directly over the same horizontal top surface of the auxiliary supporting part on which an outer portion of the mother substrate is positioned,
   wherein the shadow frame is spaced apart, in a horizontal direction, from the outer portion of the mother substrate by an interval,
   wherein the susceptor comprises an outer portion and a protrusion portion extending in a direction from an inner side of the outer portion to a top of the outer portion,
   wherein the auxiliary supporting part is positioned at the outer portion to surround a side surface of the protrusion portion, and the horizontal top surface of the auxiliary supporting part is at a same level as a top of the protrusion portion, and
   wherein the mother substrate is positioned on the protrusion portion, and the outer portion of the mother substrate protrudes outside the protrusion portion and is positioned on the top of the auxiliary supporting part such that a side surface of the protrusion portion and the top of the outer portion are not externally exposed.

2. The CVD apparatus of claim 1, wherein the auxiliary supporting part comprises a plurality of piece plates, and
   wherein two adjacent piece plates overlap each other with respect to a cross-sectional surface vertical to a top of the auxiliary supporting part.

3. The CVD apparatus of claim 2, wherein each of the plurality of piece plates comprises an overlap portion overlapping a piece plate adjacent thereto, the overlap portion comprising:
   a first section having an angle which is greater than 40 degrees and less than 50 degrees;
   a rectilinear section parallel to a lengthwise direction of each of the plurality of piece plates; and
   a second section having an angle which is greater than 40 degrees and less than 50 degrees.

4. The CVD apparatus of claim 2, wherein each of the plurality of piece plates includes a hemisphere-shaped piece plate groove in a first side, and a hemisphere-shaped susceptor groove in a second side, and is fixed to the susceptor by a fixing bolt and a supporting pin that is supporting the mother substrate.

5. The CVD apparatus of claim 1, wherein the protrusion portion comprises four rounded corners, and
   wherein the auxiliary supporting part comprises four inner corners rounded to correspond to shapes of the four rounded corners of the protrusion portion, the four inner corners being adhered to the four corners of the protrusion portion, respectively.

6. A chemical vapor deposition (CVD) apparatus comprising:
   a process chamber;
   a susceptor in the process chamber to support and heat a mother substrate;
   an auxiliary supporting part on the susceptor to support and heat an edge of the mother substrate supported by the susceptor;
   a gas spray part in the process chamber facing the susceptor, the gas spray part spraying a process gas to the mother substrate; and
   a shadow frame configured to be spaced apart from the mother substrate and supported by the susceptor, such that a whole surface of the mother substrate is exposed to the process gas, and to cover an edge of the auxiliary supporting part and an edge of the susceptor extending from the edge of the auxiliary supporting part,
   wherein a distance between a bottom surface of the shadow frame covering the edge of the auxiliary supporting part and a top surface of the auxiliary supporting part is from 0.2 mm to 0.5 mm,
   wherein the mother substrate is positioned on a horizontal top surface of the auxiliary supporting part, and the shadow frame is positioned directly over the same horizontal top surface of the auxiliary supporting part, and spaced apart from the mother substrate, in a horizontal direction, by an interval,
   wherein the auxiliary supporting part comprises a plurality of piece plates, and
   wherein two adjacent piece plates overlap each other with respect to a cross-sectional surface vertical to a top of the auxiliary supporting part,
   wherein each of the plurality of piece plates comprises an overlap portion overlapping a piece plate adjacent thereto, the overlap portion comprising:
      a first section having an angle which is greater than 40 degrees and less than 50 degrees;
      a rectilinear section parallel to a lengthwise direction of each of the plurality of piece plates; and
      a second section having an angle which is greater than 40 degrees and less than 50 degrees, and
   wherein each of the plurality of piece plates includes a hemisphere-shaped piece plate groove in a first side, and a hemisphere-shaped susceptor groove in a second side, and is fixed to the susceptor by a fixing bolt and a supporting pin that is supporting the mother substrate.

* * * * *